United States Patent
Chang

(10) Patent No.: US 8,337,716 B2
(45) Date of Patent: Dec. 25, 2012

(54) SARCOSINE COMPOUND USED AS CORROSION INHIBITOR

(75) Inventor: Song-Yuan Chang, Zhongli (TW)

(73) Assignee: UWiZ Technology Co., Ltd., Zhongli (TW)

( * ) Notice: Subject to any disclaimer, the term of this patent is extended or adjusted under 35 U.S.C. 154(b) by 253 days.

(21) Appl. No.: 12/018,796

(22) Filed: Jan. 23, 2008

(65) Prior Publication Data

US 2009/0184287 A1 Jul. 23, 2009

(51) Int. Cl.
*C09K 13/00* (2006.01)
*C09K 13/04* (2006.01)

(52) U.S. Cl. ...................... 252/79.1; 252/79.2

(58) Field of Classification Search .......... None
See application file for complete search history.

(56) References Cited

U.S. PATENT DOCUMENTS

| | | | | |
|---|---|---|---|---|
| 4,052,322 A | * | 10/1977 | Crookshank | 508/176 |
| 4,970,026 A | * | 11/1990 | Mullins et al. | 252/389.62 |
| 5,599,779 A | * | 2/1997 | Karol et al. | 508/283 |
| 5,705,089 A | * | 1/1998 | Sugihara et al. | 252/79.1 |
| 6,641,678 B2 | * | 11/2003 | DeYoung et al. | 134/36 |
| 7,118,685 B1 | * | 10/2006 | Yoneda et al. | 252/79.1 |
| 2004/0175942 A1 | * | 9/2004 | Chang et al. | 438/689 |
| 2006/0000808 A1 | * | 1/2006 | Seki et al. | 216/88 |
| 2009/0134122 A1 | * | 5/2009 | White et al. | 216/89 |

OTHER PUBLICATIONS

Tsoler et al, Handbook of Detergents, 1999, CRC Press, vol. 5, p. 21.*
Frignani et al, N-lauroyl sarcosine sodium salt as a corrosion inhibitor for type 1518 carbon steel in neutral saline environments, Mar. 1996, Corrosion, vol. 52 No. 03, Introduction.*

* cited by examiner

Primary Examiner — Nadine Norton
Assistant Examiner — Stephanie Duclair
(74) Attorney, Agent, or Firm — Jackson IPG PLLC

(57) ABSTRACT

The sarcosine compounds used as a corrosion inhibitor according to the present invention include sarcosine and salt compounds thereof. The corrosion inhibitor is used in chemical mechanical polishing compositions or post CMP clean agents, which forms a protective film on the surface of a work piece to prevent the work piece from corrosion in chemical mechanical polishing, and thus common residue defect on the surface of a work piece due to the use of a conventional corrosion inhibitor (e.g. benzotriazole (BTA)) can be improved or the surface of a work piece can be protected from corrosion in post-CMP cleaning.

4 Claims, No Drawings

SARCOSINE COMPOUND USED AS CORROSION INHIBITOR

BACKGROUND OF THE INVENTION (1) Field of the Invention

The present invention relates to sarcosine or sarcosine compounds that are especially useful for anti corrosion of metal film in chemical mechanical polishing process. The composition enhances the anticorrosion ability of a work piece without leaving residues on the surface of a polished piece, or can protect the surface of a work piece from corrosion in post-CMP cleaning process.

(2) Description of Related Art

Due to continuous reduction in critical dimensions and rapidly increased number of the wiring layers of electronic components, the RC time delay has a significantly effect on the operation speed of entire circuits. In order to improve the problems of the time delay and the reliability of electron migration due to reduction in metal line width, copper conductor material with low resistivity and high resistance to damage by electron migration has been selected to replace aluminum alloys. However, because of the difficulty of etching copper, it is necessary to employ a damascene process in forming copper lines.

Damascene processes are different from traditional metallization processes, which initially define metallic patterns followed by filling trenches with dielectric layers. In the damascene process, a conductive line trench is first etched in a flat dielectric layer, filling a metal layer therein, and finally excess metal is removed to obtain a flat structure with metal inlayed in the dielectric layer. Damascene processes have the following advantages over traditional metallization processes: (1) the surface of a substrate is always kept flat; (2) the drawback that dielectric material is difficult to be filled into the spacing between metal lines in traditional processes can be eliminated; (3) the difficulty in etching metallic material, especially etching copper metal could be solved.

Further, in order to overcome the drawback that the necessity of separately fabricating a contact window structure and a metal conductor pattern leads to complicated fabrication procedures in traditional interconnection processes, a dual damascene process has been widely adopted in the industry. In the dual damascene process, line dielectrics and via dielectrics are etched off by selective etching twice, completing barrier layers of the metal layer and of the plug at a time, filling conductive metal into the vias and interconnection trenches at a time. With its low resistivity and high resistance to electron migration, copper has been gradually used as the material of interconnecting metal replacing aluminum to meet the demand of miniaturizing while enhancing operation speed of the components. Copper damascene interconnection technology not only can achieve the miniaturization of interconnects and the reduction of RC time delay, but also solves the difficulty in etching metallic copper. Therefore, it has become the main stream in the development of multiple interconnections today.

Regardless it is a single damascene or a dual damascene the copper process needs a planarization step to remove excess metal from the dielectric layer after completing the filling of copper. Chemical mechanical polishing process is the only one technique capable to achieve a global planarization. Copper CMP is usually carried out in two stages. In the first stage most copper is removed at a high removal rate to increase throughput of the process. In the second stage, the remaining copper is polished off at a low removal rate to prevent the copper in trenches from being excess polished. The two-stage copper polishing process usually needs to utilize different polishing compositions in order to achieve the requirements in the various stages.

In general, a chemical mechanical polishing of metal layers (copper) is conducted at pH value of weak acidic condition (different from that dielectric layers conducted under alkaline conditions) an addition of oxidant (e.g. hydrogen peroxide) is necessary to initiate passivation mechanism of metal therefore chemical removal occurs. However, unlike that aluminum would form self-protection oxide layers, copper metal is easily corroded and oxidized, so copper lines are frequently corroded and thus the quality of the interconnections is significantly impacted after polishing under such conditions.

To solve the above problem, a corrosion inhibitor such as 1H-benzotriazole (BTA) is added to prevent copper or alloys thereof from corrosion under acidic medium during polishing process. However, inhibitors such as benzotriazole would often leave residues on the surface of a work piece (a wafer) and they are difficult to be removed by cleaners such as high purity deionized water and the likes. The residue causes the surface of wafer become uneven and subsequent an extra annealing process is required.

BRIEF SUMMARY OF THE INVENTION

A primary objective of the present invention is to provide a corrosion inhibitor used in chemical mechanical polishing compositions, which can enhance the anticorrosion ability of a work piece without leaving the residues on the surface of a polished piece.

To achieve the above objective, the sarcosine compounds used as a corrosion inhibitor according to the present invention include sarcosine and salt compounds thereof. The corrosion inhibitor is used in chemical mechanical polishing compositions, which can form a protective film on the surface of a work piece to prevent the work piece from corrosion during chemical mechanical polishing, furthermore common deficit associated to the utilization of a conventional corrosion inhibitor (e.g. benzotriazole (BTA)) can be improved Another objective of the present invention is to provide a corrosion inhibitor used in post CMP clean agents, which can protect the surface of a work piece from such as corrosion by cleaning solutions, oxidation, post-cleaning corrosion, galvanic corrosion or light-induced corrosion.

DETAILED DESCRIPTION OF THE PREFERRED EMBODIMENTS

The sarcosine compounds used as a corrosion inhibitor according to the present invention include sarcosine compounds such as sarcosine and salt compounds thereof, or mixtures thereof. The corrosion inhibitor is used in chemical mechanical polishing compositions, which can form a protective film on the surface of a work piece to prevent the work piece from corrosion in chemical mechanical polishing and enhance the anticorrosion ability of a work piece. The chemical mechanical polishing composition further comprises an abrasive particle, an oxidant, an accelerator, an inhibitor and a solvent.

Examples of the abrasive particle include, but not limited to, fumed silica; silica sols hydrolyzed from sodium silicate or potassium silicate, or hydrolyzed and condensed from silanes; precipitated or calcined alumina; precipitated or calcined titania; polymeric materials; and the hybrids of metal oxides and polymeric materials, and preferably silica sols. When the amount of the abrasive particle is too small, it is disadvantageous to mechanical polishing and the desired removal rate cannot be achieved. On the other hand, if the amount of abrasive particle is too much removal rate of barrier layers and insulation oxide layers would be increased but surface defects would also be elevated. In an embodiment, the silica sol is used in an amount of 0.01 to 30% by weight based on the total weight of the composition, preferably 0.1 to 15% by weight.

In view of the chemical mechanical polishing composition for polishing copper layers, it is preferable to use hydrogen peroxide as an oxidant. In general, the oxidant is used in an amount of 0.25 to 5% by weight based on the total weight of the composition, preferably 0.35 to 3% by weight.

Examples of the accelerator used in the chemical mechanical polishing composition include, but not limited to, citric acid, oxalic acid, tartaric acid, histidine, alanine or glycine. The accelerator is to promote the solution of metal to be polished, such as copper. When the added amount of the accelerator increases, it facilitates the increased removal rate of metal layers and is suitable for the metal layer polishing in the first stage. However, that the added amount of the accelerator in the polishing composition increases would result in an increase of etching rate. In an embodiment, the accelerator is used in an amount of 0.01 to 10% by weight based on the total weight of the composition, preferably 0.1 to 5% by weight, and more preferably 0.3 to 3% by weight.

The corrosion inhibitor and inhibitor of the chemical mechanical polishing composition would effectively suppress the static etching rate under the condition of high removal rate, so as to suit the polishing processes in the first and second stages. The corrosion inhibitor of the present invention is a sarcosine compound, such as sarcosine and salt compounds thereof and the like. Examples of the sarcosine and salt thereof include, but not limited to, sarcosine having the formula I,

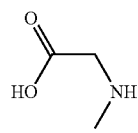

formula I $(CH_3NHCH_2COOH, CAS=107-97-1)$ lauroyl sarcosine having the formula II,

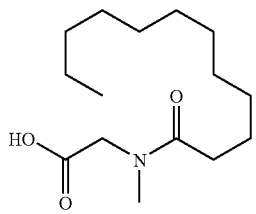

formula II $(C_{15}H_{29}NO_3, CAS 97-78-9)$

N-acyl sarcosine, cocoyl sarcosine, oleoyl sarcosine, stearoyl sarcosine and myristoyl sarcosine or lithium salts, sodium salts, potassium salts, amine salts or the like, or mixtures thereof, for example, sodium n-Lauroyl sarcosinate having the formula III.

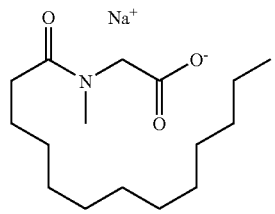

formula III $(CH_3(CH_2)_{10}CON(CH_3)CH_2COONa, CAS 137-16-6)$

In general, the corrosion inhibitor is used in an amount of 0.0005 to 1% by weight based on the total weight of the composition, preferably 0.001 to 0.5% by weight based on the total weight of the composition, and more preferably 0.005 to 0.1% by weight based on the total weight of the composition.

Examples of the inhibitor include, but not limited to, imidazoline compounds; triazole compounds and derivatives thereof, such as 1,2,4-triazole, 3-amino-1,2,4-triazole, 3-nitro-1,2,4-triazole, 3-amino-1H-1,2,4-triazole-5-carboxylic acid, 1H-benzotriazole or 5-methyl-1,2,3-benzotriazole. In general, the inhibitor is used in an amount of 0.0001 to 1% by weight based on the total weight of the composition, preferably 0.005 to 0.8% by weight based on the total weight of the composition, and more preferably 0.01 to 0.5% by weight based on the total weight of the composition.

Water can be used as the solvent of the composition of the present invention, and high purity deionized water is preferably used as the solvent of the polishing composition.

The features and functions of the present invention are further illustrated by the following Examples, but they are not to be construed to limit the scope of the present invention.

EXAMPLE 1

As listed in Table 1, the tests are conducted with polishing slurry compositions using a silica sol with an average particle size of about 90 nm as the abrasive particle, alanine, hydrogen peroxide, 1,2,4-triazole (the inhibitor), sodium cocoyl sarcosinate (the corrosion inhibitor) and water as the solvent, as control samples. The chemical formula of sodium cocoyl sarcosinate is represented by formula IV:

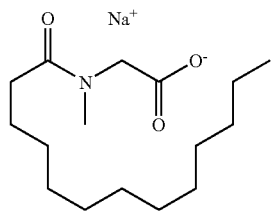

formula IV $(RCON(CH_3)CH_2COONa, CAS 61791-59-1)$

TABLE 1

| | oxidant (hydrogen peroxide) (wt %) | accelerator (alanine) (wt %) | inhibitor (wt %) | abrasive particle (silica sol) (wt %) | corrosion inhibitor ppm |
|---|---|---|---|---|---|
| control example 1 | 0.7 | 2.4 | 0.025 | 0.1 | 0 |
| control example 2 | 0.7 | 2.4 | 0.025 | 0.1 | 50 |

TABLE 1-continued

|  | oxidant (hydrogen peroxide) (wt %) | accelerator (alanine) (wt %) | inhibitor (wt %) | abrasive particle (silica sol) (wt %) | corrosion inhibitor ppm |
|---|---|---|---|---|---|
| control example 3 | 0.7 | 2.4 | 0 | 0.1 | 0 |
| control example 4 | 0.7 | 2.4 | 0 | 0.1 | 50 |

The polishing tests are conducted under the following condition:
polisher: Mirra polisher (Applied Materials)
wafer type: 8-inch copper-coated wafer (Ramco Co)
polishing pressure: 2 psig
platen speed: 90 rpm
carrier speed: 85 rpm
polishing pad: IC 1010 (Rohm and Haas)
slurry flow rate: 200 ml/min The resulted average values of the removal rate (RR) and the etch rate are recorded in Table 2.

TABLE 2

|  | Cu RR@ 1.5 psi | Cu RR@ 3 psi | etch rate, A/min |
|---|---|---|---|
| control example 1 | 4930 | 9790 | 915 |
| control example 2 | 3257 | 7729 | 319 |
| control example 3 | 7458 | >15425 | 3023 |
| control example 4 | 1470 | >15425 | 578 |

According to the results of Table 2, it has shown that in control examples 1 and 2, the removal rate of copper polishing and the etch rate in control example 1 are more than those in control example 2. In control examples 3 and 4, the removal rate of copper polishing and the etch rate in control example 3 are more than those in control example 4. From these results, we can conclude that when sodium cocoyl sarcosinate is employed as the corrosion inhibitor, the removal rate of copper polishing and the etch rate would be significantly reduced. Hence, the corrosion inhibitor can provide a better anticorrosion ability to effectively prevent a work piece from corrosion.

EXAMPLE 2

As listed in Table 3, the tests are conducted at the pH value of 11, with polishing slurry compositions respectively using a silica sol with an average particle size of about 90 nm as the abrasive particle, hydrogen peroxide, potassium hydroxide, benzotriazole (the inhibitor), as a control sample in control example 5, and using a silica sol with an average particle size of about 90 nm as the abrasive particle, hydrogen peroxide, potassium hydroxide, sodium cocoyl sarcosinate (the corrosion inhibitor) and water as the solvent, as a control sample in control example 6.

TABLE 3

|  | oxidant (hydrogen peroxide) (wt %) | abrasive particle (silica sol) (wt %) | BTA ppm | corrosion inhibitor ppm | KOH (wt %) | pH |
|---|---|---|---|---|---|---|
| control example 5 | 0.5 | 30.0 | 50 | 0 | 0.1 | 11 |
| control example 6 | 0.5 | 30.0 | 0 | 50 | 0.1 | 11 |

The polishing tests are conducted under the following condition:
polisher: Applied Material Mirra Polisher, (San Jose, Calif.)
wafer type: 8-inch copper-coated TEOS/Ta film wafer
polishing pressure: 2 psig
platen speed: 70 rpm
carrier speed: 65 rpm
polishing pad: IC 1010 (Rohm and Haas)
slurry flow rate: 200 ml/min The resulted average values of the removal rate (RR) and the etch rate are recorded in Table 4.

TABLE 4

|  | Ox removal rate (A/min) | Cu removal rate (A/min) | Ta removal rate (A/min) |
|---|---|---|---|
| control example 5 | 1244 | 657 | 633 |
| control example 6 | 1223 | 556 | 601 |

According to the results of Table 4, it has shown that the removal rates of copper polishing and tantalum (Ta) polishing in control example 5 are more than those in control example 6. From these results, we can conclude that when sodium cocoyl sarcosinate is employed as the corrosion inhibitor, the removal rates of copper and tantalum (Ta) polishing would be significantly reduced. Hence, in comparison with benzotriazole as the corrosion inhibitor, sodium cocoyl sarcosinate as the corrosion inhibitor can provide a better anticorrosion ability to effectively prevent a work piece from corrosion.

From all the above Examples, it can be found that according to the present invention, a sarcosine compound such as sarcosine and salt compounds thereof and the like, which is employed as the corrosion inhibitor in the chemical mechanical polishing compositions, can provide a better anticorrosion ability to prevent a work piece from corrosion as well as would not leave residues on the surface of a polished piece compared with the conventional use of 1H-benzotriazole (BTA) as the corrosion inhibitor.

Furthermore, the corrosion inhibitor of the present invention can also be used in post CMP cleaning agents, and the corrosion inhibitor could also be a sarcosine compound such as sarcosine and salt compounds thereof and the like, or mixtures thereof, which can protect the surface of a work piece from such as corrosion by cleaning solutions, oxidation, post-cleaning corrosion, galvanic corrosion or light-induced corrosion.

Though CMP process can planarize the surface of a work piece effectively, however, this process would leave contaminants on the surface of the work piece, so that it requires the application of post CMP clean agents for removing such residual contaminants. The cleaning purpose is to remove the residues left by CMP step from the surface of the work piece as well as would not cause significant etch of the metal, leaving residues on the surface, or subjecting the work piece to significant organic contaminants (e.g. carbon). In addition, it is ideal to protect the surface of the work piece from corrosion due to various mechanisms, such as chemical corrosion, galvanic corrosion or light-induced corrosion. The corrosion on the work piece would result in metal pitting and thinning its metal lines. The removal of organic contaminants from the surface of the work piece and the complexation with the residual copper by an acidic cleaning solution are very efficient, so that it is ideal to obtain an effective clean agent at the range from a medium to a low pH value. The acidic cleaning solution is typically used in a brush-scrubbing unit for post CMP cleaning or in an ultrasonic cleaning unit.

The post CMP clean agents may include acidic compounds and corrosion inhibitors. The acidic compounds could be citric acid, oxalic acid, phosphoric acid, amino trimethyl phosphonic acid, 1-hydroxyethylidene-1,1-diphosphoric acid, 2-phosphonobutane-1,2,4-tricarboxylic acid, nitrilotris-methylenetriphosphonic acid, hexamethylene diamine tetra methylene phosphonic acid, diethylene triamine penta methylene phosphonic acid, hexamethylene triamine penta methylene phosphonic acid, malonic acid, lactic acid, acetic acid, propanic acid, butanoic acid, pentanoic acid, hexanoic acid, succinic acid, adipic acid, malic acid, maleic acid, tartaric acid, methanesulfonic acid, benzenesulfonic acid, toluenesulfonic acid, dodecylbenzenesulfonic acid, ethylenediaminetetraacetic acid, diethylenetriaminepentaacetic acid, nitrilotriacetic acid, N-(hydroxyethyl)-ethylenediaminetri-acetic acid or combinations thereof. The corrosion inhibitor could be a sarcosine compound, such as sarcosine and salt compounds thereof and the like. Examples of the sarcosine and salt thereof include, but not limited to, sarcosine, N-acyl sarcosine, lauroyl sarcosine, cocoyl sarcosine, oleoyl sarcosine, stearoyl sarcosine and myristoyl sarcosine or lithium salts, sodium salts, potassium salts or amine salts, or mixtures thereof.

EXAMPLE 3

As listed in Table 5, the post CMP cleaning tests are conducted with post CMP clean agents using the compositions described in control examples 7 to 9, and the copper loss of the wafer surface in each control example has been compared.

TABLE 5

|  | citric acid (wt %) | oxalic acid (wt %) | lauroyl sarcosine ppm | cocoyl sarcosine ppm |
| --- | --- | --- | --- | --- |
| control example 7 | 0.2 | 0.2 | 0 | 0 |
| control example 8 | 0.2 | 0.2 | 20 | 0 |
| control example 9 | 0.2 | 0.2 | 0 | 20 |

The post CMP cleaning tests are conducted under the following condition:
wafer type: two 2000 Å-thick copper-coated wafers
cleaning equipment: Ontrak post CMP brush box (Lam Research, Calif. USA)
clean agent flow rate: 300 ml/min
cleaning time: 50 seconds
The results of the copper loss analyzed by TXRF (total reflection X-ray fluorescence spectrometer) are recorded in Table 6.

TABLE 6

|  | Cu loss (Å/min) |
| --- | --- |
| control example 7 | 21.66 |
| control example 8 | 16.47 |
| control example 9 | 13.34 |

According to the results of Table 6, it has shown that the copper loss in control examples 8 and 9 is less than that in control example 7, so the addition of lauroyl sarcosine or cocoyl sarcosine to the post CMP clean agents can effectively suppress the copper loss.

EXAMPLE 4

As listed in Table 7, the post CMP cleaning tests are conducted with post CMP clean agents using the compositions described in control examples 7 to 9, and the copper loss of the wafer surface in each control example has been compared.

TABLE 7

|  | citric acid (wt %) | dodecyl-benzenesulfonic acid (wt %) | sodium cocoyl sarcosinate ppm |
| --- | --- | --- | --- |
| control example 10 | 0.25 | 0.0085 | 0 |
| control example 11 | 0.25 | 0.0085 | 10 |

The post CMP cleaning tests are conducted under the following condition: wafer type: two 2000 Å-thick copper-coated wafers
cleaning unit: Ontrak post CMP brush box (Lam Research, Calif. USA)
clean agent flow rate: 300 ml/min
cleaning time: 50 seconds
The resulted average values of the copper loss analyzed by TXRF (total reflection X-ray fluorescence spectrometer) are recorded in Table 8.

TABLE 8

|  | average value of copper loss Å/min |
| --- | --- |
| control example 10 | 13.92 |
| control example 11 | 11.71 |

According to the results of Table 8, it has shown that the copper loss in control example 11 is less than that in control example 10, so the addition of sodium cocoyl sarcosinate to the post CMP clean agents can effectively suppress the copper loss.

From the above Examples 3 and 4, it can be found that according to the present invention, a sarcosine compound such as sarcosine and salt compounds thereof, which is employed as the corrosion inhibitor in the post CMP clean agents, can protect the surface of a work piece from such as corrosion by cleaning solutions, oxidation, post-cleaning corrosion, galvanic corrosion or light-induced corrosion.

The technical contents and features of the present invention are disclosed above. However, anyone familiar with the technique could possibly make modify or change the details in accordance with the present invention without departing from the technologic ideas and spirit of the invention. The protection scope of the present invention shall not be limited to what embodiment discloses, and should include various modification and changes that are made without departing from the technologic ideas and spirit of the present invention, and should be covered by the claims mentioned below.

What is claimed is:

1. A post CMP clean agent, consisting essentially of a sarcosine compound or salt thereof as a corrosion inhibitor, in combination with an acidic compound and an aqueous solvent, wherein the sarcosine compound has the formula:

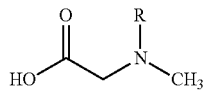

wherein R is N-acyl, and the acyl group is cocoyl.

2. The post CMP clean agent as described in claim 1, wherein the acidic compound is selected from the group consisting of citric acid, oxalic acid, phosphoric acid, amino trimethyl phosphonic acid, 1-hydroxyethylidene-1,1-diphosphoric acid, 2-phosphonobutane-1,2,4-tricarboxylic acid, nitrilotrismethylenetriphosphonic acid, hexamethylene diamine tetra methylene phosphonic acid, diethylene triamine penta methylene phosphonic acid, hexamethylene triamine penta methylene phosphonic acid, malonic acid, lactic acid, acetic acid, propionic acid, butanoic acid, pentanoic acid, hexanoic acid, succinic acid, adipic acid, malic acid, maleic acid, tartaric acid, methanesulfonic acid, benzenesulfonic acid, toluenesulfonic acid, dodecylbenzenesulfonic acid, ethylenediaminetetraacetic acid, diethylenetriaminepentaacetic acid, nitrilotriacetic acid, N-(hydroxyethyl)-ethylenediaminetriacetic acid or combinations thereof.

3. The post CMP clean agent, as described in claim 1, wherein said salt is selected from the group consisting of lithium, sodium, potassium and amine.

4. The post CMP clean agent, as described in claim 1, wherein the aqueous solvent is water.

* * * * *